United States Patent [19]

Minami et al.

[11] Patent Number: 5,132,758

[45] Date of Patent: Jul. 21, 1992

[54] SEMICONDUCTOR DEVICE AND MANUFACTURING METHOD THEREOF

[75] Inventors: Masataka Minami, Hitachi; Youkou Wakui, Tohkai; Takahiro Nagano, Hitachi, all of Japan

[73] Assignee: Hitachi, Ltd., Tokyo, Japan

[21] Appl. No.: 308,777

[22] Filed: Feb. 9, 1989

[30] Foreign Application Priority Data

Feb. 12, 1988 [JP] Japan .................. 63-28680

[51] Int. Cl.$^5$ .................. H01L 29/10; H01L 29/78
[52] U.S. Cl. .................. 357/23.4; 357/23.1; 357/23.3
[58] Field of Search .................. 357/23.4, 23.3, 23.9, 357/23.14, 23.1, 23.3

[56] References Cited

U.S. PATENT DOCUMENTS 4,502,202  3/1985  Malhi .................. 357/23.9

FOREIGN PATENT DOCUMENTS

| | | | |
|---|---|---|---|
| 55-052262 | 4/1980 | Japan | 357/23.9 |
| 59-061182 | 4/1984 | Japan | 357/23.9 |
| 59-231864 | 12/1984 | Japan | 357/23.3 |
| 62-248256 | 10/1987 | Japan | 357/23.14 |
| 63-177471 | 7/1988 | Japan | 357/23.3 |

*Primary Examiner*—Jerome Jackson, Jr.
*Assistant Examiner*—Hung Xuan Dang
*Attorney, Agent, or Firm*—Antonelli, Terry, Stout & Kraus

[57] ABSTRACT

In a MOSFET of an LDD structure, a side wall is made conductive and connected to a gate through a resistance thereby to cause hot carriers taken into the side wall to be discharged to a gate through the resistance, whereby a channel resistance is prevented from being increased by an effect of carriers accumulated in the side wall. As a result, a reliable MOSFET with a short channel can be provided which is not degraded even if it is used for a long time.

18 Claims, 3 Drawing Sheets

SEMICONDUCTOR DEVICE AND MANUFACTURING METHOD THEREOF

BACKGROUND OF THE INVENTION

The present invention relates to a semiconductor device of a MIS or MOS structure such as a MOSFET or the like formed on a semiconductor substrate, and more specifically, to this kind of a highly reliable semiconductor device.

Recently, the gate length of a semiconductor device is made very fine with the progress of a fine processing technology for the semiconductor device such as a MOSFET or the like, which permits the degree of integration and the performance of an integrated circuit composed of the MOSFET to be greatly improved. However, as the gate is made fine, various problems arise. These problems include, for example, reduced reliability such as a degradation and the like caused by a hot carrier effect, a reduction in a breakdown voltage between a source and a drain, a short channel effect and the like. They are very disadvantageous in a MOSFET having a gate length of 2 μm or less. The problem of the degradation due to the hot carrier effect arises especially in an n channel MOSFET, and then it will be described below with reference to the n channel MOSFET as an example.

There is, for example, a MOSFET of an LDD (Lightly Doped Drain) structure as a conventional technology which is known best as a means to solve the problem of the degradation of the MOSFET caused by this hot carrier effect, the technology being proposed at the National Convention of the Institute of Electronics and Communication Engineers of Japan, 1978 (paper No. 270 of National Convention Report, Apr. 1978).

FIG. 1 shows a diagram of a structure of a MOSFET of the conventional technology, wherein reference numeral 1 designates a p type substrate, reference numeral 2 designates a gate oxide film, reference numeral 3 designates a gate, reference numeral 4 designates an n type low concentration layer, reference numeral 5 designates a side wall, reference numeral 6 designates a source or drain diffusion layer, reference numeral 7 designates a passivation film, and reference numeral 8 designates source and drain electrodes.

The MOSFET of the LDD structure (referred to as an LDDMOSFET, hereinafter) is characterized in that an offset region of ten n type low concentration layer 4 is provided between the source diffusion layer 6 or the drain diffusion layer 6 and a channel region formed on the lower layer of the gate 3. The LDDMOSFET is manufactured by forming an n type high concentration layer in such a manner that ions are implanted to form the n type low concentration layer 4, using the gate 3 provided on the p type substrate 1 through the gate oxide film 2 as a mask, and then ions are implanted for the source and drain diffusion layers 6 after the side wall 5 has been formed by a silicon oxide film.

With the LDDMOSFET, since the introduction of the n type low concentration layer 4 enables an electric field effect in the channel region in the vicinity of the drain to be eased and a width of a depletion layer extending in the direction of the channel region from the drain to be reduced, the hot carrier effect is prevented, a breakdown voltage between the source and the drain is increased, and the short channel effect is prevented. More specifically, the LDDMOSFET has a less degradation caused by the effect of hot carriers and can establish higher reliability (prevention of malfunction) in a MOSFET with a shorter gate length.

The LDDMOSFET according to the conventional technology, however, has a problem that when it is provided with a shorter gate length, it is subject to a serious degradation caused by hot carriers and cannot maintain reliability. Some models are proposed with respect to a mechanism of the degradation caused by the hot carriers and a degradation mechanism characteristic to the LDDMOSFET will be described with reference to drawings.

FIG. 2A and FIG. 2B are diagrams explanatory of a degradation mechanism of the LDDMOSFET, wherein reference numerals 9, 10, 12 designate electrons, respectively, and reference numeral 11 designates a hole. Like reference numerals used in FIG. 1 describe similar or corresponding parts.

A strong electric field exists at the drain end in the MOSFET, and as shown in FIG. 2A, an electron-hole pair composed of the electron 10 and the hole 11 is created by the electron 9 accelerated there and the electron passes over a potential barrier of the gate oxide film 2, and as shown in FIG. 2B, it advances into the side wall 5 to be caught. The side wall 5 becomes negatively charged by the caught electron 12 and electrons in the n type low concentration layer 4 are reduced in the vicinity of the gate oxide film 2, i.e., in the vicinity of the substrate surface, and thus a resistance of the portion is increased. Then, as described above, the LDDMOSFET according to the conventional technology has the problem that it has a limit in establishing reliability for hot carriers when it is provided with a shorter gate length, and when the gate has a certain length (0.5 μm) or a length less than it, the LDDMOSFET cannot establish the reliability.

As shown in Japanese Patent Publication No. 62-156873, there is a method to connect a spacer (side wall) insulated and separated from a gate electrode to source and drain regions to solve the problem of the hot carriers, but with the method a capacity between a gate and a source or between the gate and a drain is increased and a circuit speed is reduced.

Further, as shown in Japanese Patent Publication 62-122273, there is a method to integrally construct a gate electrode and a conductive side wall structurally or electrically, but this method increases a circuit delay.

SUMMARY OF THE INVENTION

An object of the present invention is to provide a MOSFET semiconductor device having a larger hot carrier withstanding amount while maintaining a high speed as compared with an LDDMOSFET of the conventional technology.

The present invention to achieve the above object is characterized in that a side wall formed to a side wall of the gate 3 of the MOSFET is made conductive and the side wall is connected to the gate through a resistance member.

BRIEF DESCRIPTION OF THE DRAWINGS

The above and other objects, features and advantages of the present invention will be described hereinafter with respect to the accompanying claims and drawings, in which like reference numerals are used to describe similar parts throughout the several view of the invention, and wherein:

DETAILED DESCRIPTION OF THE PREFERRED EMBODIMENT

The present invention will be now described in detail with respect to drawings. The present invention makes a side wall of a gate electrode of a MOSFET conductive and connects the side wall to the gate electrode through a resistance member so that electrons taken into the side wall can be discharged through the resistance member and the gate electrode. When a resistance of the resistance member is suitably set to a resistance of $1 \times 10^3$ ohm to $1 \times 10^{12}$ ohm in the case, almost no effect is given by a parasitic capacitance existing between the side wall and an offset region (low concentration region) forming a portion of a drain diffusion layer. More specifically, when the resistance of the resistance member is selected to a value larger than a certain degree and a time constant by the resistance and the above parasitic capacitance is set longer than a cycle at which the MOSFET element actually operates, a delay of a circuit operation caused by the parasitic capacitance can be ignored. On the other hand, electrons as hot carriers are injected only when a potential of the gate is at a high level, and when the period is long, the electrons taken into the side wall are increased. However, since the side wall is made conductive and connected to the gate through the resistance member, the electrons taken in are gradually absorbed by the gate and not accumulated in the side wall, and thus a degradation such as a gm drop of a channel conductance of an LDDMOSFET or the like is not caused.

Figure 3:
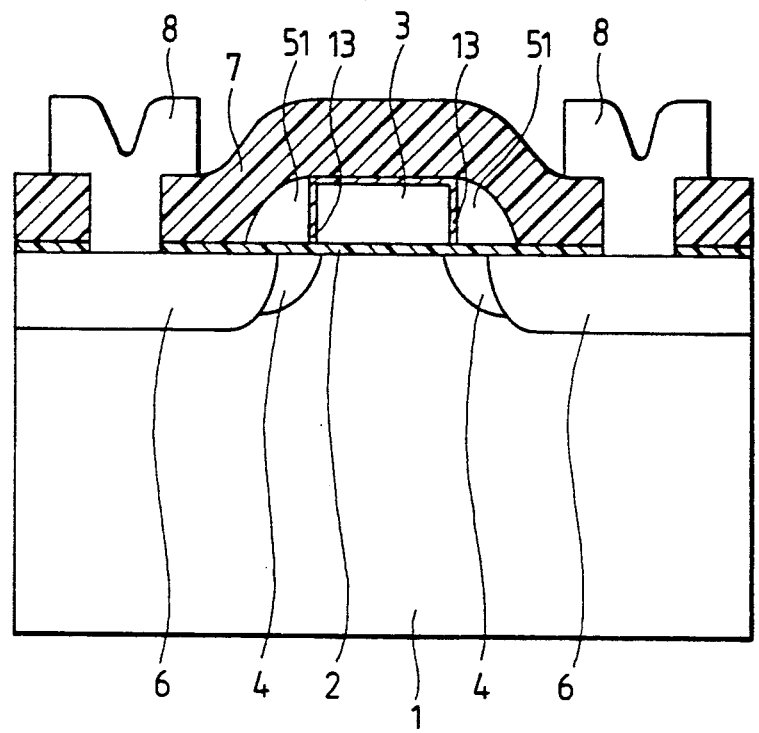
FIG. 3 is a cross-sectional view of a structure of a MOSFET of an embodiment of the present invention.
Figure 4:
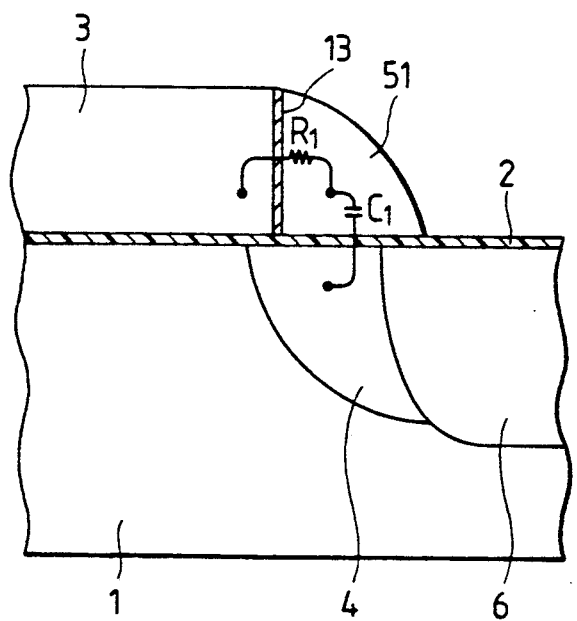
FIG. 4 is a schematic view explanatory of operation of the present invention.

FIG. 3 is a diagram of a structure of a MOSFET as an embodiment of a semiconductor device according to the present invention and FIG. 4 is a diagram explanatory of a mechanism capable of reducing a degradation by the present invention, wherein reference numeral 13 designates a resistance member, reference numeral 51 designates a side wall and other reference numerals are similar to those of the conventional technology shown in FIG. 3.

Like the conventional LDDMOSFET, the MOSFET according to the present invention comprises a gate 3, source and drain diffusion layers 6 ($2 \times 10^{20}$ cm$^{-3}$), an offset region of an n type low concentration layer 4 ($1 \times 10^{18}$ cm$^{-3}$) and the side wall 51, as shown in FIG. 3. The MOSFET is different from the LDDMOSFET of the conventional technology in that the side wall 51 has conductivity (the same degree with the gate electrode) and that the resistance member is formed between the side wall 51 and the gate 3. The resistance of the resistance member is set to a degree of $1 \times 10^3$ ohm $-1 \times 10^{12}$ ohm and a material thereof is a silicon oxide film, a silicon nitride or a non-doped polysilicon having a thickness of several to several tens of angstroms. A polysilicon doped with n type impurities or the like can be used as a material for the side wall 51. The side wall may have a p type conductivity. The side wall 51 may extend onto the source and the drain.

For example, the structure of the MOSFET of this embodiment can be produced as follows. First, ions are implanted (dosing amount of phosphorus; $1 \times 10^{13}$ cm$^{-2}$ at 50 Kev) using the gate 3 provided on a p type substrate 1 through a gate oxide film 2 as a mask to form an n type low concentration layer 4 (concentration: $1 \times 10^{18}$ cm$^{-3}$). The gate 3 is formed of a so-called polyside composed of a polysilicon or a polysilicon with a silicide layer added thereto. Next, the surface of the gate 3 is oxidized and provided with a silicon oxide film of several to several tens of angstrom to form the resistance member 13. Alternatively, the surface of the gate 3 may be provided with a silicon oxide film or a silicon nitride film by a chemical vapor phase reaction. Then, after a polysilicon doped with intrinsic or n type impurities has been deposited by a chemical vapor phase reaction, an anisotropic etching such as an RIE etching or the like is effected to form the side wall 51 on a side wall of the gate 3. Next, an ion implantation of n type impurities (dosing amount; $5 \times 10^{15}$ cm$^{-3}$) is effected by a self-aligning system using the gate 3 and side wall 51 as masks to form source and diffusion layers. At the time, an ion implantation of n type impurities (concentration; $2 \times 10^{20}$ cm$^{-3}$) is also effected to the side wall 51 so that the side wall 51 is provided with a low resistance (the same degree as the gate electrode). The MOSFET of this embodiment is produced by the above processes.

Figure 1:
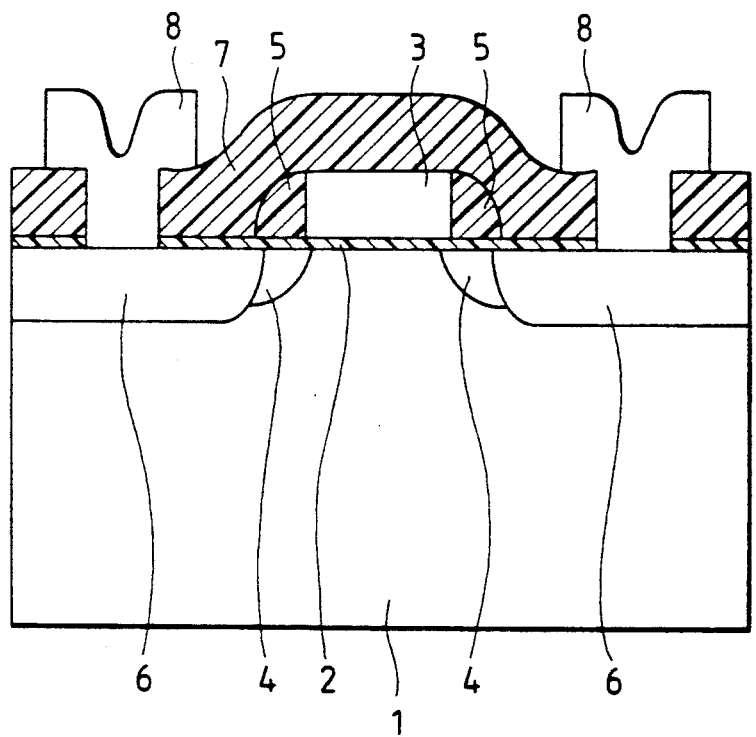
FIG. 1 is a cross-sectional view of a structure of a MOSFET according to a conventional technology.
Figure 2A:
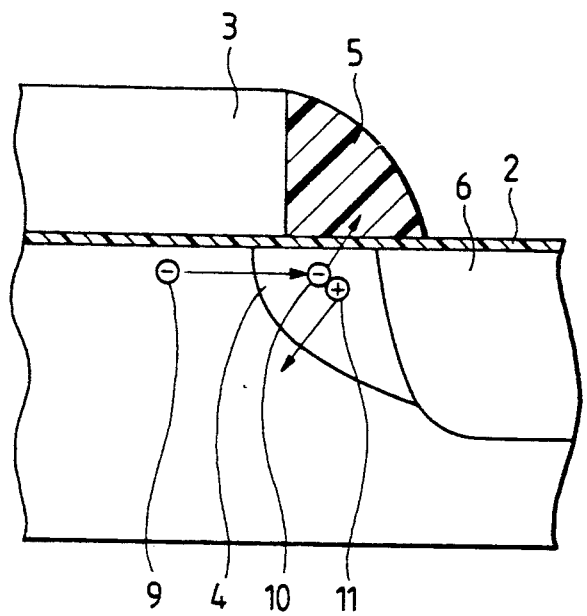
FIG. 2A and FIG. 2B are cross-sectional views of a device explanatory of a degradation mechanism of an LDDMOSFET.
Figure 2B:
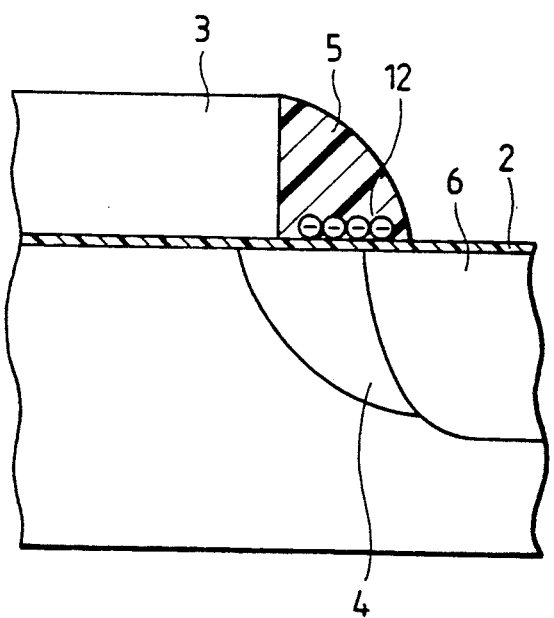

As described above, since the MOSFET according to the present invention makes the side wall 51 conductive and connects it to the gate 3 through the resistance member 13, electrons taken into the side wall 51 are externally discharged through the resistance member 13 and the gate 3. The reason why the resistance member 13 has a resistance of $1 \times 10^3$ ohm $- 1 \times 10^{12}$ ohm is to eliminate the effect of the parasitic capacitance (drop of a circuit speed) existing between the side wall 51 and the n type low concentration layer 4 on the operation an element so as not to cause the side wall 51 to operate as a gate. More specifically, as shown in FIG. 2, assuming that the resistance of the resistance member 13 is $R_1$ and the parasitic capacitance is $C_1$, the gate is 3 is connected to the n type low concentration layer 4 through a series circuit of the resistance $R_1$ and the parasitic capacitance $C_1$. When the resistance of the resistance member 13 is selected and a time constant of the resistance $R_1$ and the parasitic capacitance $C_1$ is made longer than a cycle at which the MOSFET actually operates (a figure or two figures larger than the cycle), a delay of the circuit operation can be ignored. In addition, since the electrons taken into the side wall 51 are not accumulated in the side wall 51 and discharged through the resistance $R_1$, a degradation such as a drop of gm is not caused.

Although the present invention is described above with respect to the example of the n channel MOSFET, the present invention can be applied to a p channel MOSFET by changing the conductivity of the impurities.

Since the above side wall 51 has a conductivity, it is thought to be a gate electrode from a view point that it is provided through a passivation film, and then it may be assumed that this embodiment of the present invention has a structure comprising first, second, and third gate electrodes (the first and third gate electrodes are the side wall 51), and the first and third electrodes are connected to the second gate electrode through the resistance member, respectively.

As described above, since the present invention has such a simple structure that the resistance member 13 is interposed between the conductive member 51 (also referred to as a conductive side wall) formed on the low concentration ($1 \times 10^{18}$ cm$^{-3}$) impurity region, it can be easily achieved.

In addition, a MOSFET with a short channel of 0.5 μm or less can be provided without lowering a power voltage (e.g., to lower it from 5 V to 3 V) or degrading a circuit performance.

According to the present invention, as described below, the side wall in an LDDMOSFET is provided with a conductivity and the side wall is connected to the gate through a resistance member to discharge hot carriers taken into the side wall, and thus an increase in a resistance a low concentration impurity layer interposed between a drain diffusion layer and a channel region can be restricted. As a result, a reliable MOSFET with a short channel can be provided which is not degraded even if it is used for a long time.

What is claimed is:

1. A semiconductor device having two impurity regions of a first conductivity type formed in a semiconductor region of an opposite conductivity type, and a gate electrode formed through an insulation film formed to cover at least a region between said two impurity regions on a main surface of said semiconductor region, characterized in that said two impurity regions have a predetermined low impurity concentration in the vicinity of said gate electrode, a conductive member is provided to cover said low impurity concentration region, and said conductive member is connected to said gate electrode through a resistance having a predetermined resistance value to permit a current flow between said conductive member and said gate electrode to discharge stored charges in said conductive member to said gate electrode.

2. A semiconductor device according to claim 1, wherein said conductive member is comprised of a poly-crystal semiconductor.

3. A semiconductor device having two impurity regions of a first conductivity type formed in a semiconductor region of an opposite conductivity type, and a gate electrode formed through an insulation film formed to cover at least a region between said two impurity regions on a main surface of said semiconductor region, characterized in that said two impurity regions have a predetermined low impurity concentration in the vicinity of said gate electrode, a conductive member is provided to cover said low impurity concentration region, and a resistance member is interposed between said conductive member and said gate electrode having a predetermined resistance value to permit a current flow between said conductive member and said gate electrode to discharge stored charges in said conductive member to said gate electrode.

4. A semiconductor device according to claim 3, wherein said conductive member and said gate electrode are comprised of the same material.

5. A semiconductor device according to claim 3, wherein said conductive member is comprised of a poly-crystal semiconductor.

6. A semiconductor device according to claim 3, said resistance member is comprised of a semiconductor oxide.

7. A semiconductor device having two impurity regions of a first conductivity type formed in a semiconductor region of an opposite conductivity type, and a gate electrode formed through an insulation film formed to cover at least a region between said two impurity regions on a main surface of said semiconductor region, characterized in that said gate electrode is divided into a first gate electrode, a second gate electrode, and a third gate electrode, said first gate electrode lies on one of said impurity regions, said third electrode lies on the other of said impurity regions, and the first gate electrode is connected to the second gate electrode through a resistance and the second gate electrode is connected to the third gate electrode through a resistance, wherein the resistance has a resistance value to permit a current flow between the first gate electrode and the second gate electrode, and between the third gate electrode and the second gate electrode to discharge stored charges from said first and third gate electrodes to said second gate electrode.

8. A semiconductor device according to claim 7, wherein said first, second and third gate electrodes are comprised of the same material.

9. A semiconductor device according to claim 7, wherein said first, second and third gate electrodes are comprised of a poly-crystal semiconductor.

10. A semiconductor device according to claim 7, wherein said first gate electrode and said third gate electrode are electrically connected to said second electrode through a resistance.

11. A semiconductor device of a MIS or MOS structure of a metal/insulation film/semiconductor formed on a semiconductor substrate wherein, after a predetermined low concentration impurity layer has been formed using a gate as a mask, a side wall is provided on a gate side and a low concentration offset region is provided between high concentration source and drain diffusion layers and a channel layer using the side wall as a mask, characterized in that said side wall is made conductive and said side wall is electrically connected to a gate electrode through a resistance to permit discharging stored charges from said side wall to said gate electrode through said resistance.

12. A semiconductor device according to claim 11, wherein said side wall and said gate electrode are comprised of the same material.

13. A semiconductor device according to claim 11, wherein said side wall is composed of a poly-crystal semiconductor.

14. A semiconductor device having two impurity regions of one conductivity type formed in a semiconductor region of an opposite conductivity type and a gate electrode provided on a main surface of siad semiconductor region between said two impurity regions through an insulation film, characterized in that a conductive member is formed on a side wall of said gate electrode through a resistance layer having a predetermined resistance value to permit a current flow between the conductive member and the gate electrode to discharge stored charges from said conductive member to said gate electrode.

15. A semiconductor device comprising:
a first semiconductor region having a first conductivity type:
second and third semiconductor regions of a second conductivity type formed in said first semiconductor region to be spaced apart from another by a predetermined region in a main surface of said first semiconductor region, wherein each of siad second and third regions includes a low impurity region, having an impurity concentration lower than other portions of said second and third semiconductor regions, formed to be adjacent to said predetermined region of said fist semiconductor region;

a gate electrode formed to cover at least said predetermined region of said first semiconductor region, wherein said gate electrode is separated from said predetermined region by a gate insulation film;

first and second conductive members respectively formed to cover each of said low impurity regions of said second and third semiconductor regions; and resistance means formed to respectively couple said first and second conductive members and said gate electrode, wherein said resistance means has a predetermined resistance value to permit a current flow between said first and second conductive members and the gate electrode to permit discharging stored charges from said first and second conductive members to said gate electrode.

16. A semiconductor device according to claim 15, wherein said first and second conductive members and said gate electrode are comprised of the same material.

17. A semiconductor device according to claim 15, wherein said resistance means comprises a resistance member interposed between said first conductive member and said gate electrode and between said second conductive member and said gate electrode.

18. A semiconductor device comprising;

a first semiconductor region having a first conductivity type;

second and third semiconductor regions of a second conductivity type formed in said first semiconductor region to be spaced apart from one another by a predetermined region in a main surface of said first semiconductor region; and a gate electrode separated from said predetermined region by a gate insulation film, wherein said gate electrode comprises a first gate portion formed to cover at least a predetermined portion of said second semiconductor region, a second gate portion formed to cover at least a predetermined portion of said third semiconductor region, and a third gate portion formed between said first and second gate portions, wherein said first and second gate portions are respectively coupled to said third gate portion by a resistance means, wherein said resistance means has a predetermined resistance value to permit a current flow between said first and second gate portions and the third gate portion to permit discharging stored charges from said first and second gate portions to said third gate portion.

* * * * *